(12) United States Patent
Nagano et al.

(10) Patent No.: US 8,488,092 B2
(45) Date of Patent: Jul. 16, 2013

(54) ARRAY SUBSTRATE AND LIQUID CRYSTAL DISPLAY DEVICE USING THE SAME

(75) Inventors: Shingo Nagano, Tokyo (JP); Yuzo Odoi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 186 days.

(21) Appl. No.: 13/040,782

(22) Filed: Mar. 4, 2011

(65) Prior Publication Data
US 2011/0216278 A1 Sep. 8, 2011

(30) Foreign Application Priority Data
Mar. 8, 2010 (JP) .................................. 2010-050537

(51) Int. Cl.
*G02F 1/1343* (2006.01)
(52) U.S. Cl.
USPC ......................................... 349/138; 349/141
(58) Field of Classification Search
None
See application file for complete search history.

(56) References Cited

U.S. PATENT DOCUMENTS

| 6,233,034 | B1 | 5/2001 | Lee et al. | |
| 8,189,157 | B2 * | 5/2012 | Watanabe et al. | 349/141 |
| 2005/0270445 | A1 * | 12/2005 | Lee et al. | 349/108 |

FOREIGN PATENT DOCUMENTS
JP 11-202356 7/1999

* cited by examiner

*Primary Examiner* — Richard Kim
(74) *Attorney, Agent, or Firm* — Oblon, Spivak, McClelland, Maier & Neustadt, L.L.P.

(57) ABSTRACT

An array substrate including: a pixel defined by both a scanning line and a signal line intersecting with the scanning line, wherein a display area on a substrate includes a plurality of pixels arranged in a matrix shape, wherein the pixel includes: a switching device; a lower electrode that is connected to the switching device; an insulating film that is formed on the lower electrode; and an upper electrode that is formed on the insulating film to generate a fringe electric field between the lower electrode and the upper electrode, and wherein, in an area where the upper electrode is not formed and light is not transmitted, a contact hole is provided on a conducting pattern having the same potential as the lower electrode, by removing the insulating film.

8 Claims, 8 Drawing Sheets

ARRAY SUBSTRATE AND LIQUID CRYSTAL DISPLAY DEVICE USING THE SAME

CROSS-REFERENCE TO RELATED APPLICATION

This application claims priority from Japanese Patent Application No. 2010-050537 filed on Mar. 8, 2010, the entire subject matter of which is incorporated herein by reference.

BACKGROUND

1. Technical Field

The present invention relates to an array substrate and a liquid crystal display device. More specifically, the present invention relates to an array substrate in a fringe field switching (hereinafter also referred to as FFS) type and a configuration of a liquid crystal display device using the same.

2. Background

Recently, instead of conventional cathode-ray tubes, new display apparatuses having a thin and flat display panel using such as liquid crystal, electroluminescence and charged particles, etc., is widely used. A liquid crystal display device, which is representative of the new display apparatuses, has not only a thin and lightweight but also low power consumption and low voltage driving characteristics. The liquid crystal display device has two substrates and the liquid crystal is sealed therebetween. One substrate is an array substrate having a display area in which a plurality of pixels is arranged in a matrix shape, and the other substrate is a counter substrate having a color filter, a black matrix (shielding plate), etc., formed thereto.

Superficially, in a thin film transistor (hereinafter also referred to as TFT) type liquid crystal apparatus, the TFT, which is a switching device, is provided in the respective pixels on the array substrate to maintain a voltage, which independently drives the liquid crystal of the respective pixels. Therefore, it is possible to display high-definition image having little crosstalk. Further, the respective pixels are provided with a scanning line (gate line), which controls of the TFTs state between ON and OFF, and a signal line (source line) intersecting with the scanning line to input image data. Generally, the respective pixels correspond to respective areas surrounded by the scanning line and the signal line.

In an in-plane switching (hereinafter referred to as IPS) liquid crystal display device, a plurality of pixel electrode and a plurality of counter electrode (common electrode) are alternately arranged at an interval on one array substrate, and an electric field is applied in a direction substantially horizontal to the substrate to display the image. The IPS type has a superior view angle and has an advantage over a typical twisted nematic (TN) type. However, the related IPS liquid crystal display device has a disadvantage that light transmittance is inferior to the typical TN type.

In order to solve the above problem, a fringe field switching (FFS) type has been considered (for example, see JP-A-11-202356, FIGS. 19 to 21). In the FFS type liquid crystal display device, a fringe electric field (oblique electric field including both components of a horizontal electric field and a vertical electric field) is applied to the liquid crystal to display the image. In the FFS liquid crystal display device, the pixel electrode and the counter electrode are formed on one array substrate, similar to the IPS type. However, the pixel electrode and the counter electrode are vertically arranged, and an insulating film is interposed therebetween. Typically, the lower electrode has a plate shape, and the upper electrode has a slit shape or a comb shape that have a gap part and a branch electrode part.

In the FFS type LCD, either the lower electrode or the upper electrode can be configured as the pixel electrode. Since the liquid crystal is driven by the fringe electric field between the upper electrode and the lower electrode in the FFS type LCD, the liquid crystal on the branch electrode part of the upper electrode can be also driven and be served to display. Thus, the light transmittance is improved in the FFS type LCD, compared to the IPS type LCD in which a part of the pixel electrode and the counter electrode scarcely serve to display.

SUMMARY

However, the related FFS type LCD has an asymmetric electrode configuration. In detail, except for an oriented film formed at an interface of the array substrate and the liquid crystal, the lower electrode is covered by an insulating film but the upper electrode is not covered by the insulating film. Accordingly, remnant charges are easily generated in the lower electrode covered by the insulating film. As a result, a screen burn-in phenomenon in which an afterimage is remained in the display is easily occurred.

Specifically, in case that the lower electrode is the pixel electrode, the lower electrode is separated by TFTs being the switching elements for each of the pixels, and the lower electrode is to be an electrically floating state when the TFT is turned off. Moreover, since the lower electrode is covered by the insulating film, the remnant charges are easily remained. Accordingly, the screen burn-in is easily occurred, compared to a configuration, in which the lower electrode is the counter electrode having a reference potential common to all pixels and the upper electrode is the pixel electrode.

A present invention made in consideration of the above problems. An object in an aspect of the present invention is to provide a configuration capable of suppressing the screen burn-in occurred in an FFS type array substrate, in which a lower electrode is a pixel electrode and an upper electrode is a counter electrode and a liquid crystal display device using the same.

An array substrate in an aspect of the present invention includes a pixel defined by both a scanning line and a signal line intersecting with the scanning line, wherein a display area on a substrate includes a plurality of pixels arranged in a matrix shape, wherein the pixel includes: a switching device; a lower electrode that is connected to the switching device; an insulating film that is formed on the lower electrode; and an upper electrode that is formed on the insulating film to generate a fringe electric field between the lower electrode and the upper electrode, and wherein, in an area where the upper electrode is not formed and light is not transmitted, a contact hole is provided on a conducting pattern having the same potential as the lower electrode, by removing the insulating film.

According to an aspect of the present invention, it is possible to achieve an FFS type array substrate and a liquid crystal display device having a configuration capable of suppressing screen burn-in.

DESCRIPTION OF PREFERRED ILLUSTRATIVE ASPECTS

Figure 1:
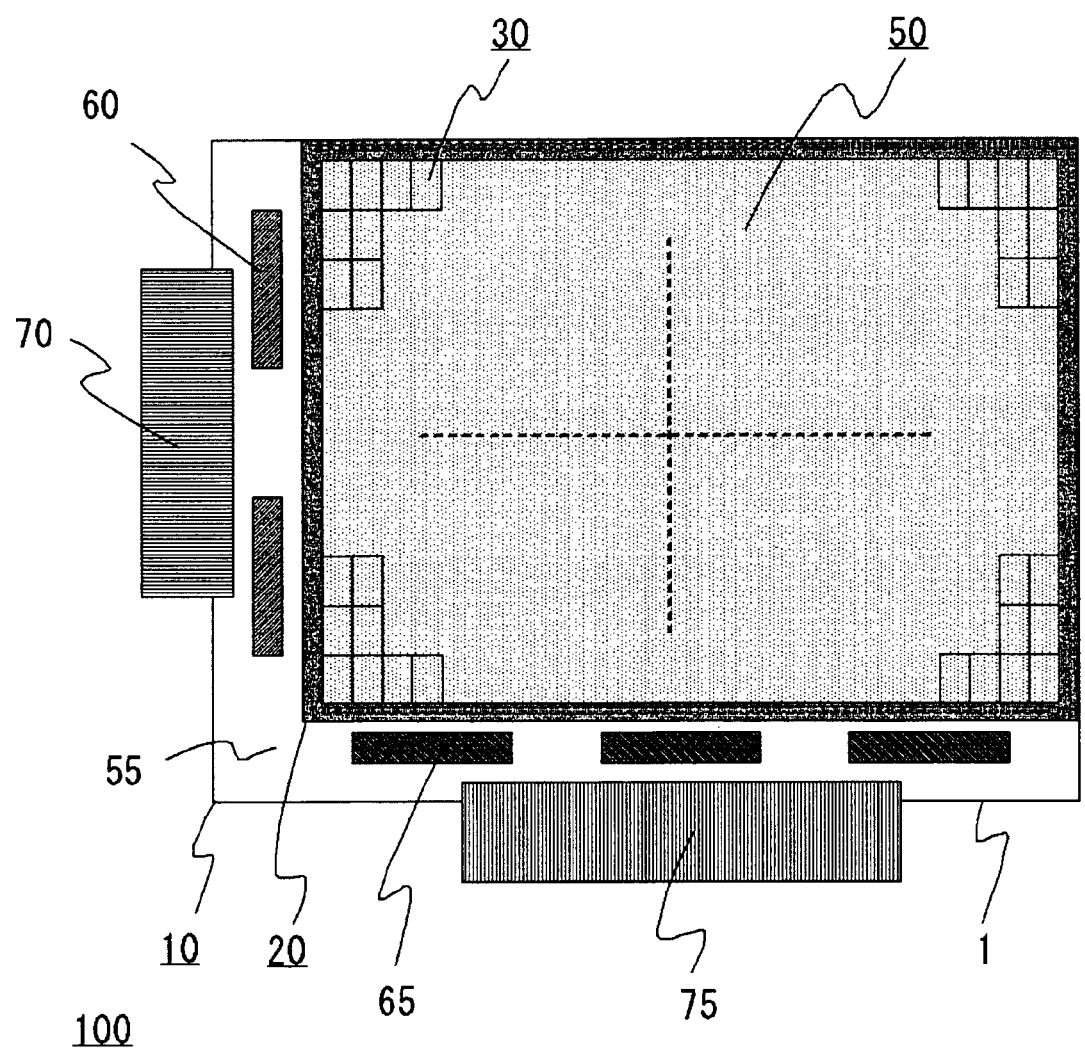
FIG. 1 is a plan view schematically showing an array substrate and a liquid crystal display device according to a first illustrative aspect.

Hereinafter, illustrative aspects of an array substrate and a liquid crystal display device in an aspect of the present invention will be described with reference to the drawings. In the respective drawings for describing each illustrative aspect, the same reference numerals indicate the same or equivalent parts. Thus, the repetitive descriptions will be omitted.

First Illustrative Aspect

First, a configuration of an array substrate and a liquid crystal display device in the present invention will be briefly described. FIG. 1 is a plan view schematically showing an array substrate and a liquid crystal display device according to a first illustrative aspect.

A liquid crystal display device 100 has a display area 50 in which a plurality of pixels 30 is arranged in a matrix shape. In addition, the liquid crystal display device includes a liquid crystal cell that is made by bonding an array substrate 10, and a counter substrate 20. A scanning line, a signal line, a TFT, a pixel electrode (not shown), etc., are formed on the array substrate 10. The counter substrate 20 faces the array substrate 10 with interposing the liquid crystal and includes a color filter and a black matrix, etc. A deflection plate and a phase plate (not shown) are adhered on both sides of the liquid crystal cell, and then a backlight, an external circuit, a housing (not shown), etc., are provided. Thus, the liquid crystal display device 100 is made up.

The array substrate 10 has the display area 50 and a frame area 55 surrounding the display area 50, on an insulating substrate 1 made of such as glass and plastic. A scanning line driving circuit 60 and a signal line driving circuit 65 are mounted on the frame area 55 by a Chip On Glass mount technology (hereinafter also referred to as COG). In addition, an end portion of the insulating substrate 1 includes a plurality of terminals (not shown) for flexible substrates 70 and 75. The flexible substrates 70 and 75 connect with an external circuit for supplying a control signal, a clock, image data, etc., to the scanning line driving circuit 60 and the signal line driving circuit 65.

Meanwhile, the liquid crystal display device 100 includes a lead line of the scanning line or the signal line and an input line. The lead line extends from the display area 50 to output unit of the scanning line driving circuit 60 or the signal line driving circuit 65, and the input line connects an input unit of each the scanning line driving circuit 60 and the signal line driving circuit 65 and a plurality of the terminal for the flexible substrates 70 and 75 that are provided to the end portion of the insulating substrate 1. However, the lines are not shown to simply FIG. 1.

In case that a small-sized panel, since the lines are relatively few, a driving circuit usually includes the scanning line driving circuit 60 and the signal line driving circuit 65. At the same time, the flexible substrates 70 and 75 are usually bundled into one piece.

Figure 2:
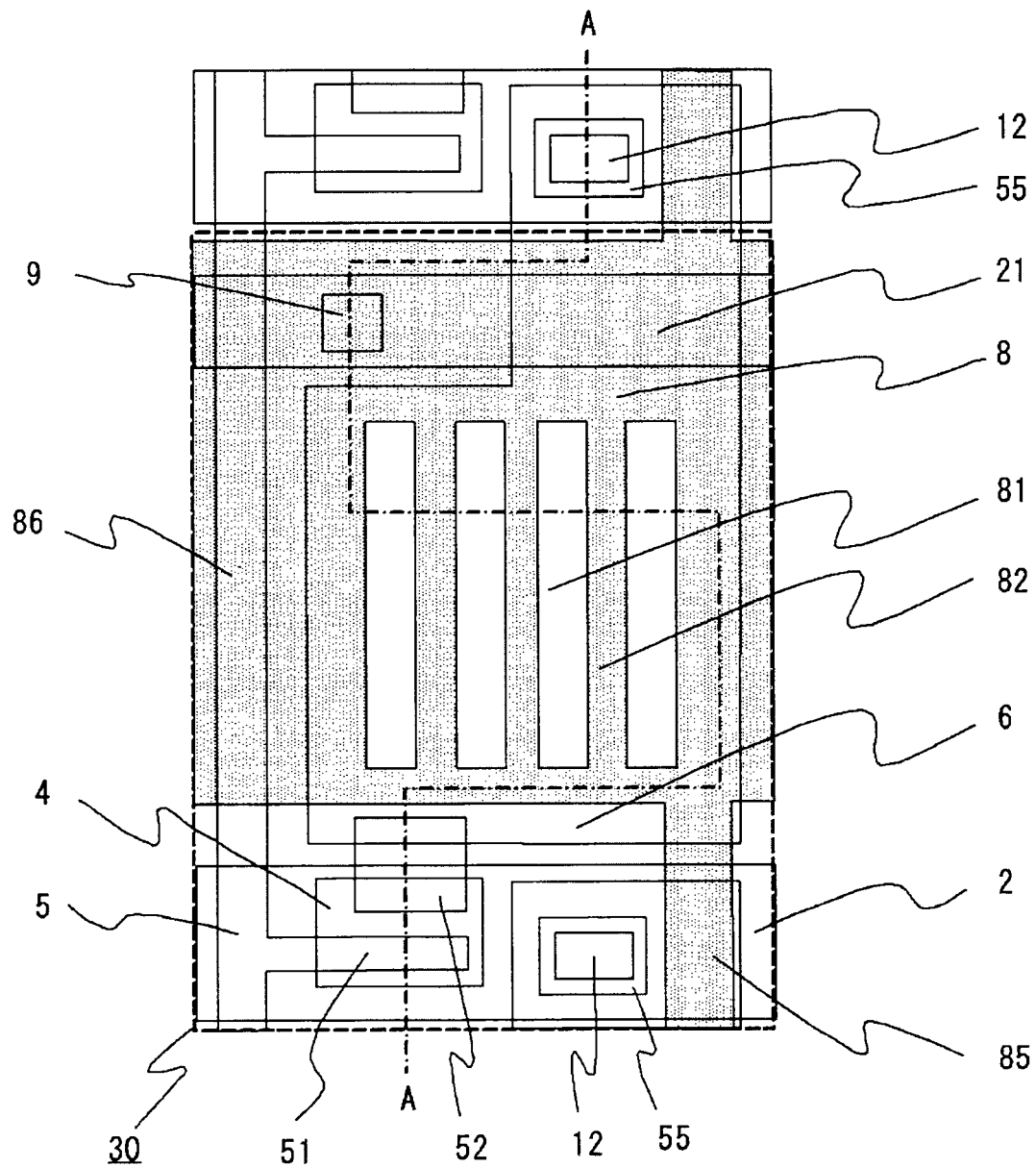
FIG. 2 is an enlarged plan view of a pixel of the array substrate in the liquid crystal display device according to the first illustrative aspect.
Figure 3:
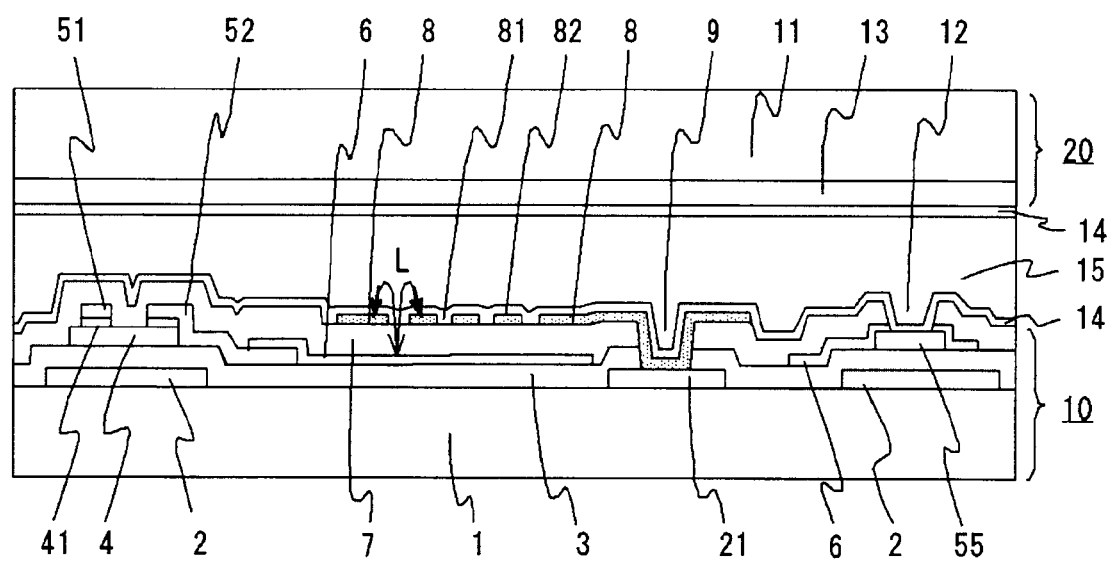
FIG. 3 is a cross sectional view of the liquid crystal display device taken along a line A-A of FIG. 2.

FIG. 2 is an enlarged plan view of a pixel of an array substrate according to the first illustrative aspect. FIG. 3 is a cross sectional view of the liquid crystal display device according to the first illustrative aspect, taken along a line A-A of FIG. 2.

As shown in FIGS. 2 and 3, a scanning line 2 and a common line 21 formed at the same layer is provided on the insulating substrate 1 made of glass and plastic etc. The scanning line 2 is made of metal such as Al, Cr, Mo, Ti, Ta, W, Ni, Cu, Au, Ag, etc., or alloy or a stacked film thereof, and the a common line 21 is arranged in parallel to the scanning line and supplies a reference potential to an counter electrode.

Then, a gate insulating film 3 made of oxide film, nitride film, etc., is formed on an entire surface of the upper layer. A semiconductor film 4 and an ohmic contact film 41 doped impurities are stacked on a part of the gate insulating film 3 on the scanning line 2.

Then, a signal line 5, which is made of metal such as Al, Cr, Mo, Ti, Ta, W, Ni, Cu, Au, Ag, etc., or alloy or stacked film thereof, is formed on the gate insulating film 3 so as to intersect the scanning line 2. In addition, a source electrode 51 and a drain electrode 52 provided at the same layer as the signal line 5 are formed to overlap with the ohmic contact film 41. After that, the ohmic contact film 41 not overlapped by the source electrode 51 and the drain electrode 52 is removed. In other words, the ohmic contact film 41 between the source electrode 51 and the drain electrode 52 is removed, and a channel part of a TFT is formed. The scanning line 2 below the channel part also serves as a gate electrode. As a result, a TFT being a switching device is configured.

In the meantime, the semiconductor film 4 and the ohmic contact film 41 may be extended and be arranged along the signal line 5 not only in the TFT area.

A lower electrode 6 having a plate shape is a pixel electrode and is made of transparent conducting oxide film such as Indium Tin Oxide (hereinafter also referred as to ITO). In a reflection type LCD, the lower electrode may be formed by a conducting film having a high reflective surface and made of metal such as Al, Ag, Pt, etc., or alloy or a stacked film thereof. A part of the lower electrode 6 is overlapped on the drain electrode 52 and is electrically connected thereto. In the meantime, a part of the lower electrode 6 may be formed below the drain electrode 52 and may be electrically connected thereto.

A protecting film 7, which is made of an oxide film, a nitride film, etc., an organic resin insulating film or a stacked film thereof, is formed at an upper layer of the signal line 5, the TFT and the lower electrode 6.

An upper electrode 8 made of a transparent conducting oxide film, such as ITO, is formed on the protecting film 7. As shown in FIG. 2, the upper electrode 8 has a plurality of gap part 81, in which transparent conducting oxide film is not provided, and a plurality of branch electrode part 82 that are electrically connected in common. In the first illustrative aspect, the upper electrode 8 has a slit shape that the gap parts 81 are surrounded by the transparent conducting oxide film. A fringe electric field is generated between the branch electrode part 82 and the lower electrode 6 exposed from the gap part 81 through the protecting film 7. The liquid crystal 15 is driven by the fringe electric field. Herein and after, the word "expose" means that a part of one electrode is not covered by the protecting film 7.

The upper electrode 8 is connected to the common line 21 via a contact hole 9 and serves as the counter electrode having a reference potential. Since the upper electrode 8 made of a transparent conducting oxide film has a specific resistance that is higher than that of the scanning line 2 or the signal line 5 made of a metal film, the upper electrode 8 is connected to the common line 21 formed at the same layer as the scanning line 2 for each pixel 30 for reducing the resistance. In the meantime, when the upper electrode 8 has a predetermined reference potential, it is not necessarily required to provide the contact hole 9 for each pixel 30.

Although it is not shown, a terminal electrode is provided in an area of a terminal part for COG or a terminal part for the flexible substrate, and each terminal part is formed with a contact hole at the gate insulating film 3 or the protecting film 7 for electrical connection with the scanning line 2 or the signal line 5. Typically, in order to improve corrosion-resistance, a transparent conducting oxide film formed at the same layer as the upper electrode 8 is formed on a surface of the terminal electrode.

The protecting film 7 for each pixel 30 includes not only than the contact hole 9 but also a second contact hole 12, which is provided on a conducting pattern 55 having the same potential as the lower electrode 6, in an area where the light is not transmitted by removing the insulating film. Further, the upper electrode 8 is not formed in an area the second contract hole 12.

In the first illustrative aspect, the contact hole 12 is formed at a part of the lower electrode 6 of the pixel electrode extending and overlapping the scanning line 2 of the pixel 30 adjacent to up side or down side. When the lower electrode 6 in the area of the second contact hole 12 is made of the same transparent conducting oxide film, such as ITO, as the upper electrode 8, it may be removed during an etching process of the upper electrode 8. In order to avoid it, the lower electrode 6 in an area of the second contact hole 12 is stacked on the conducting pattern 55, which is formed at the same layer as the signal line 5 and has the same potential as the second contact hole 12. As a result, even when the lower electrode 6 in the area of the second contact hole 12 is removed during the etching process of the upper electrode 8, it is possible to expose the conducting pattern 55 having the same potential as the lower electrode 6 through the second contact hole 12.

In the meantime, when the lower electrode 6 in the area of the second contact hole 12 is not removed during the etching process of the upper electrode 8, it is possible to utilize a part of the lower electrode 6 in the area of the second contact hole 12 as a conducting pattern having the same potential as the lower electrode 6, so that it is not necessary to form the conducting pattern 55 formed at the same layer as the signal line 5 at the lower layer.

Since the second contact hole 12 is provided in an area of the scanning line 2 that does not serve to display, the reduction of the light transmittance due to the second contact hole 12 is not occurred.

In the first illustrative aspect, the upper electrode 8 of an counter electrode is connected to the upper electrode 8 of the adjacent pixels 30 through the connection parts 85 and 86, which connects the each upper electrodes 8 at the same layer. The pixels are adjacent in the direction of the signal line 5 (up-down direction in FIG. 2) and the direction of the scanning line 2 (left-right direction in FIG. 2). A part of the scanning line 2 and the signal line 5 are covered by the connection parts 85 and 86 to form a lattice (mesh) shape. As a result, the resistance of the upper electrode 8 is further reduced.

By the lattice shape, even when the common line 21 is break and the reference potential is not supplied from the common line 21 to the upper electrode 8 through the contact hole 9, the reference potential is supplied from the upper electrode 8 of the adjacent pixel 30 to the corresponding upper electrode 8 through the connection parts 85 and 86. As a result, a display error is not prevented and the yield is improved.

In addition, the connection parts 85 and 86 cover the scanning line 2 or the signal line 5, so that it is possible to block a leakage electric field from the scanning line 2 or the signal line 5 to the liquid crystal 15. Accordingly, it is possible to suppress the display error due to the leakage electric field that is easy to be generated adjacent to the scanning line 2 or the signal line 5.

In order to effectively block the leakage electric field from the scanning line 2 or the signal line 5, a width of the conducting film of the connection parts 85 and 86 covering the scanning line 2 or the signal line 5 is preferably 2 micrometers or more larger than an edge of the scanning line 2 or the signal line 5.

In addition, since the connection parts 85 and 86 have a function of a light shielding film, it may be possible to omit a black matrix along with the scanning line 2 or the signal line 5 from the counter substrate 20 having a color filter 13, a back matrix, etc., formed on an insulating substrate 11.

Additionally, the connection parts 85 and 86 may be connect to the upper electrode 8 of the adjacent pixel 30 only in one side of the signal line 5 direction (up-down direction) or the scanning line 2 direction (left-right direction).

In assembling the liquid crystal cell, after an oriented film 14 made of organic resin such as polyimide is applied, the array substrate 10 and the counter substrate 20 are performed by an orientation process using technologies of rubbing, optical orientation etc., so that liquid crystal molecules of the liquid crystal 15 are directed in a predetermined direction.

The array substrate 10 and the counter substrate 20 are stacked so that the oriented film 14 face to each other, and then the substrates are bonded by a seal material formed at the periphery of the display area 50 with an interval of about several micrometers formed by a spacer member. The liquid crystal 15 is sealed into the space of the inner side of the seal material.

After the deflection plate or the phase plate is adhered on both sides of the liquid crystal cell formed as described above, the scanning line driving circuit 60, the signal line driving circuit 65 and the flexible substrate 70 and 75 are mounted. An external circuit for supplying various electric signals to the liquid crystal cell is mounted, and a backlight unit is provided a backside of the liquid crystal cells in a case transmission type, after that the material is provided to the housing. Thus, the liquid crystal display device 100 is made up.

Next, the effect in an aspect of the present invention will be described in detail. According to the first illustrative aspect, it is possible to achieve configuration in which the conducting pattern 55 having the same potential as the lower electrode 6 being the pixel electrode is exposed to the surface in the area of the second contact hole 12 on the array substrate 10. In addition, the upper electrode 8 being the counter electrode is exposed to the surface.

As shown in FIG. 3, the liquid crystal display device 100 has the liquid crystal 15 that is sealed in the space between the array substrate 10 and the counter substrate 20, and the respective interfaces of the array substrate 10 or counter substrate 20 and the liquid crystal 15 are formed with the oriented films 14.

In the liquid crystal display device 100, the electrical path (path of the electric field) between the lower electrode 6 being the pixel electrode and the lower electrode 8 being the counter electrode serve to display. In the area except for the second contact hole 12, the electrical path passes the protecting film 7, the oriented film 14, the liquid crystal 15 and the oriented film 14, in between the lower electrode 6 and the upper electrode 8 as shown with arrows L.

Accordingly, the electrical path between the lower electrode 6 and the upper electrode 8 passes the protecting film 7 and the oriented film 14. In contrast, the electrical path between the upper electrode 8 and the liquid crystal 15 passes only the oriented film 14. In other words, the lower electrode 6 and the upper electrode 8 have asymmetry regarding whether the protecting film 7 is exist in the electrical path to the liquid crystal 15.

Generally, the liquid crystal display device 100 is driven by an alternating current driving method that is reversing polarities for each frame. However, when the asymmetry exists in the electrical path, a difference of the movement of charges between the lower electrode 6 and the upper electrode 8 is occurred. As a result, the remnant charges are easy to be generated in the lower electrode 6 that is at the lower layer of the protecting film 7.

In contrast, when the second contact hole 12 is provided in the area that does not serve to display and does not transmit the light, similar to the first illustrative aspect, only the oriented film 14 exists in the electrical path between the conducting pattern 55 having the same potential as the lower electrode 6 and the liquid crystal 15.

Since the lower electrode 6 is a conducting film, the remnant charges of the lower electrode 6 can easily move to the conducting pattern 55 in the area of the second contact hole 12. That is, the area of the second contact hole 12 becomes an area having the same symmetry as the upper electrode 8 in the electrical path up to the liquid crystal 15. Accordingly, a difference of the remnant charges between the lower electrode 6 and the upper electrode 8 is difficult to generate.

In the meantime, the oriented film 14 made of an organic resin is formed in the area of the second contact hole 12 and on the upper electrode 8. However, since the oriented film is thin, such as from 50 to 200 nm, and has an n insulation property lower than that of the protecting film 7, the remnant charges of the lower electrode 8 and the upper electrode 9 can easily move to the liquid crystal 15 via the oriented film 14. As a result, the remnant charges are difficult to generate in the lower electrode 6 and the upper electrode 8.

As described above, according to the array substrate 10 of the first illustrative aspect, in the area in which the upper electrode 8 is not formed and light is not transmitted, the second contact hole 12, through which the conducting pattern 55 having the same potential as the lower electrode 6 is exposed, is provided in the protecting film 7. Therefore, it is possible to suppress the problem caused by the remnant charges of the lower electrode 6, in the FFS liquid crystal display device 100 in which the lower electrode 6 is used as the pixel electrode. Thus, the screen burn-in is reduced.

In addition, the second contact hole 12 is provided on the scanning line 2, so that it is possible to prevent the reduction in the light transmittance due to the second contact hole 12.

Second Illustrative Aspect

Figure 4:
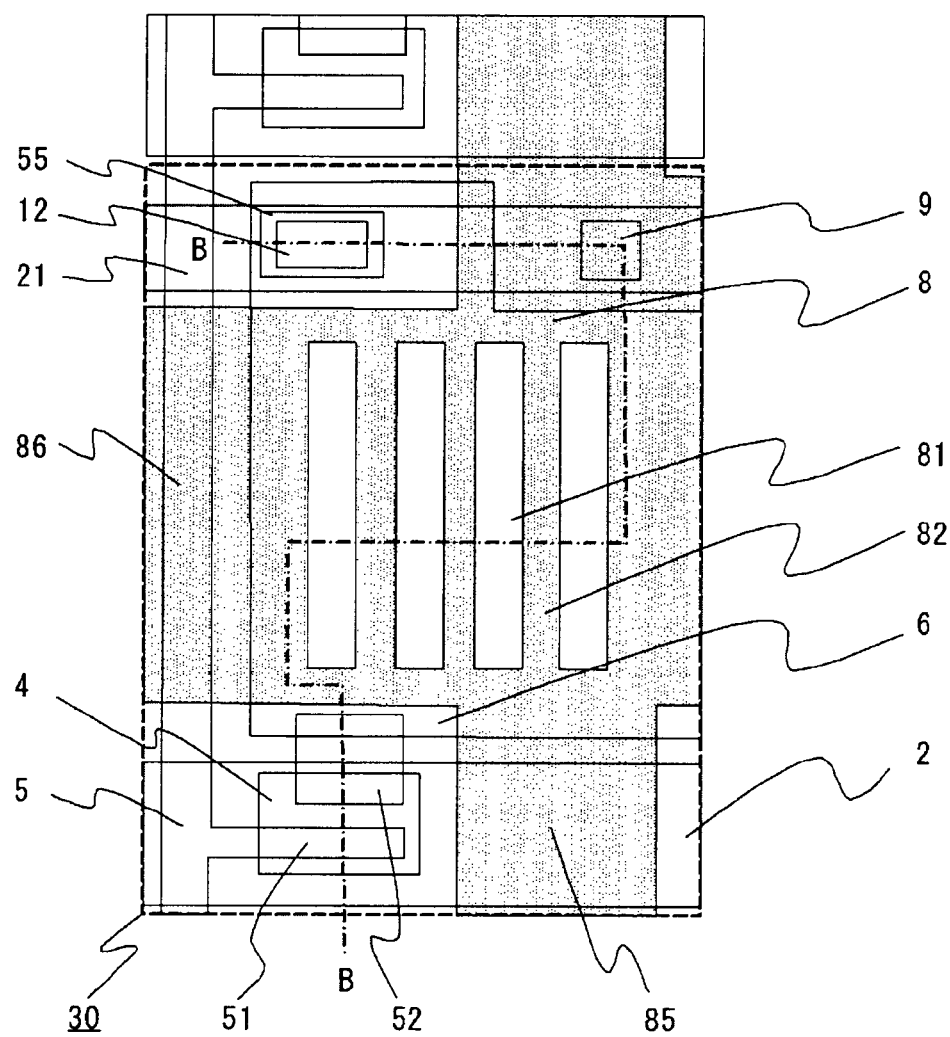
FIG. 4 is an enlarged plan view of a pixel of an array substrate in a liquid crystal display device according to a second illustrative aspect.
Figure 5:
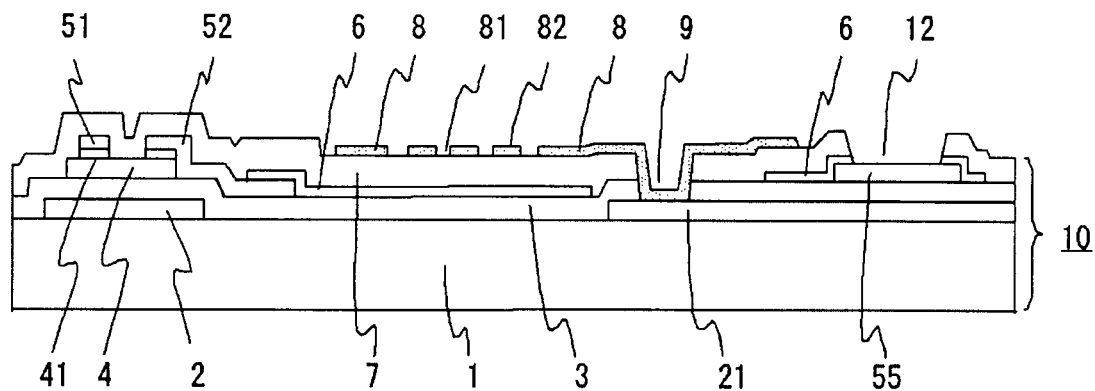
FIG. 5 is a cross sectional view taken along a line B-B of FIG. 4.

FIG. 4 is an enlarged plan view of a pixel of an array substrate in a liquid crystal display device according to a second illustrative aspect. FIG. 5 is a cross sectional view taken along a line B-B of FIG. 4.

In the cross sectional views of the liquid crystal display device 100 of the second to sixth illustrative aspects, because the configurations of the oriented film 14, the liquid crystal 15 and the counter substrate 10 are similar to the first illustrative aspect, the array substrate 10 is only shown.

According to the second illustrative aspect, the second contact hole 12 is formed on the conducting pattern 55 having the same potential as the lower electrode 6 formed at the same layer as the signal line 5 above the common line 21 formed at the same layer as the scanning line 2. In addition, the upper electrode 8 is not formed in the area adjacent to the second contact hole 12.

When the lower electrode 6 in the area of the contact hole 12 is not removed during the etching process of the upper electrode 8, a part of the lower electrode 6 in the area of the contact hole 12 can be used as a conducting pattern having the same potential as the lower electrode 7. Thus, it is not necessary to form the conducting pattern 55 formed at the same layer as the signal line 5 at the lower layer.

In addition, not similar to the first illustrative aspect, it is not necessary to overlap the lower electrode 6 being the pixel electrode with the scanning line 2 of the pixel 30 adjacent on the up side or down side. Therefore, an increase in the capacity of the scanning line 2, which is due to the overlapping of the scanning line 2 and the lower electrode 6, is prevented. As a result, it is possible to suppress an increase in the driving load of the scanning line 2.

According to the second illustrative aspect, the second contact hole 12, through which the conducting pattern 55 having the same potential as the lower electrode 6 being the pixel electrode is exposed, is provided above the common line 21 formed at the same layer as the scanning line 2, in the protecting film 7. Accordingly, it is possible to suppress the remnant charges of the lower electrode 6. As a result, the screen burn-in is reduced, similar to the first illustrative aspect.

In addition, since a part of the common line 21 also does not serve to display and does not transmit the light, it is possible to prevent the reduction in the light transmittance due to the second contact hole 12, similar to the first illustrative aspect.

Third Illustrative Aspect

Figure 6:
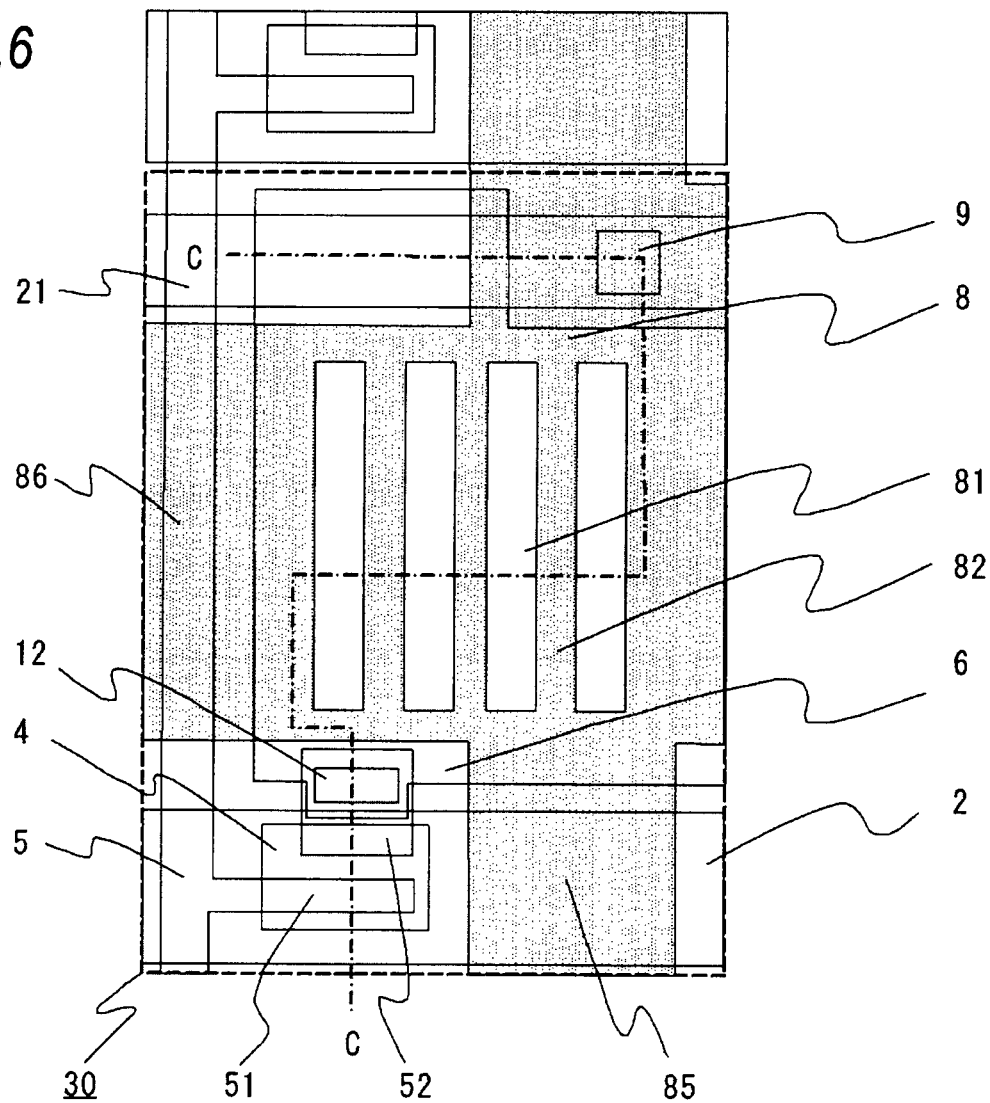
FIG. 6 is an enlarged plan view of a pixel of an array substrate in a liquid crystal display device according to a third illustrative aspect.
Figure 7:
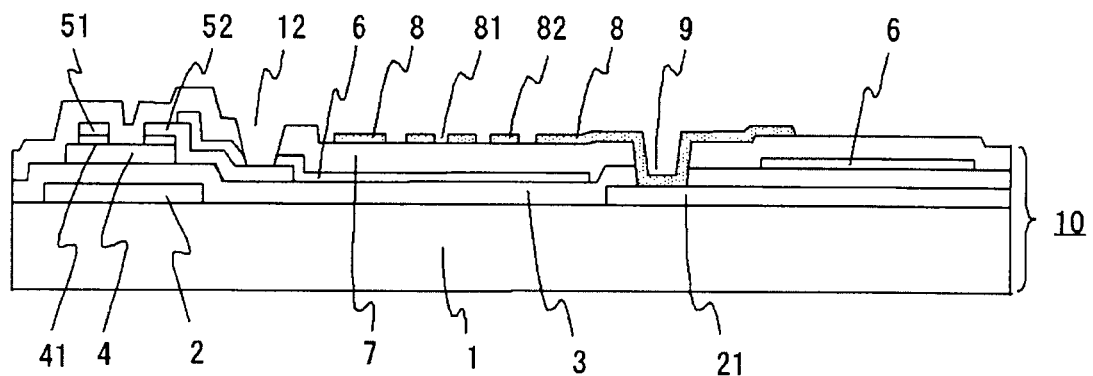
FIG. 7 is a cross sectional view taken along a line C-C of FIG. 6.

FIG. 6 is an enlarged plan view of a pixel of an array substrate in a liquid crystal display device according to a third illustrative aspect. FIG. 7 is a cross sectional view taken along a line C-C of FIG. 6.

According to the third illustrative aspect, the second contact hole 12 is provided in an area of the drain electrode 52. In FIG. 6, the second contact hole 12 is formed to expose the drain electrode 52, which is a conducting pattern having the same potential as the lower electrode 6. In the meantime, when the lower electrode 6 in the area of the contact hole 12 is not removed during the etching process of the upper electrode 8, a part of the lower electrode 6 on the drain electrode 52 may be used as a conducting pattern having the same potential as the lower electrode 6.

According to the third illustrative aspect, the second contact hole 12, through which the conducting pattern 55 having the same potential as the lower electrode 6 being the pixel electrode is exposed, is provided on the drain electrode 52 in the protecting film 7. Accordingly, it is possible to suppress the remnant charges of the lower electrode 6. As a result, the screen burn-in is reduced, similar to the first and second illustrative aspects.

In addition, since a part of the drain electrode 52 does not serve to the display and does not transmit the light, it is possible to prevent the reduction in the light transmittance due to the second contact hole 12, similar to the first and second illustrative aspects.

Fourth Illustrative Aspect

Figure 8:
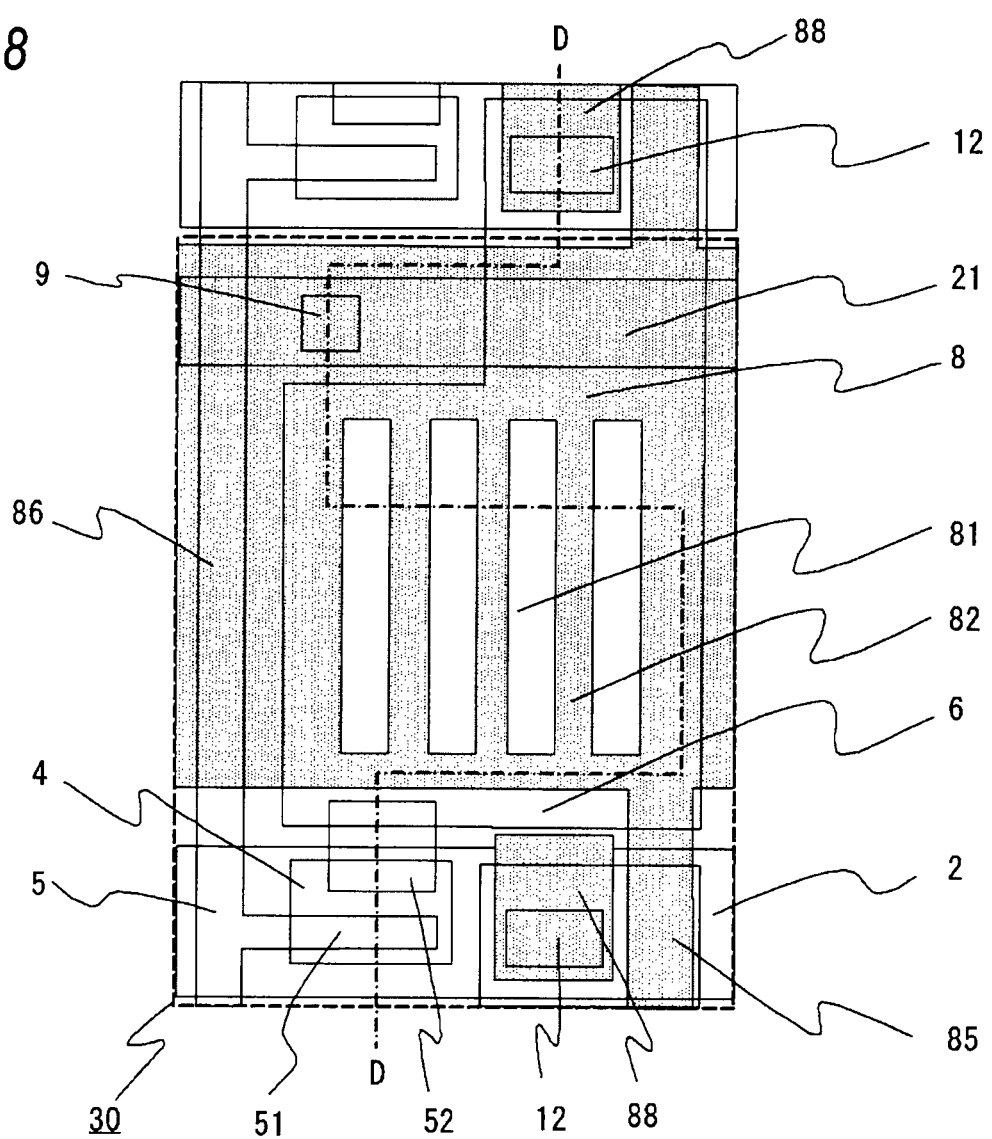
FIG. 8 is an enlarged plan view of a pixel of an array substrate according to a fourth illustrative aspect.
Figure 9:
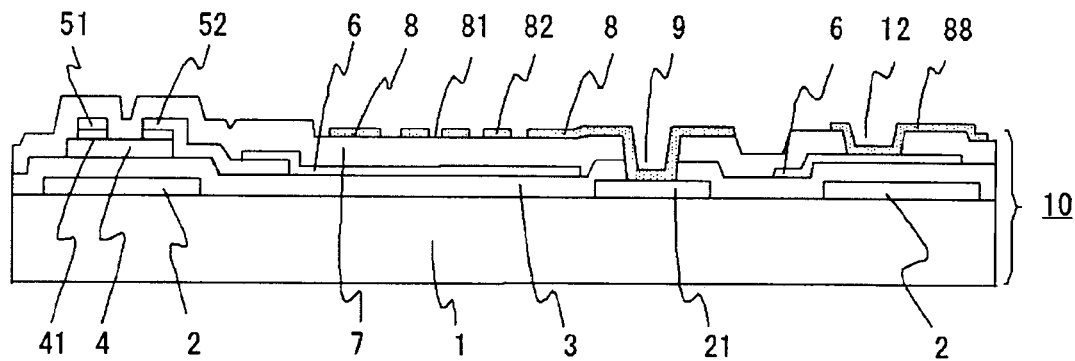
FIG. 9 is a cross sectional view taken along a line D-D of FIG. 8.

FIG. 8 is an enlarged plan view of a pixel of an array substrate in a liquid crystal display device according to a fourth illustrative aspect. FIG. 9 is a cross sectional view taken along a line D-D of FIG. 8.

The fourth illustrative aspect relates to improvement of the first illustrative aspect. According to the fourth illustrative aspect, an electrode pattern 88 is arranged adjacent to the area of the second contact hole 12 above the scanning line 2 of the pixel 30 adjacent on the up side and down side, and the electrode pattern 88 is connected to a conducting pattern (here, a part of the lower electrode 6) having the same potential as the lower electrode 6. The electrode pattern 88 has the same potential as the lower electrode 6 being the pixel electrode. Although the electrode pattern 88 is formed at the same layer as the upper electrode 8, it is electrically separated from the upper electrode 8.

According to the fourth illustrative aspect, since the second contact hole 12 is covered by the electrode pattern 88 formed at the same layer as the upper electrode 8, the lower electrode 6 in the area of the second contact hole 12 is protected during the etching process of the upper electrode 8. Accordingly, since it is possible to utilize the conducting pattern having the same potential as the lower electrode 6 as a part of the lower electrode 6, it is not necessary to provide the conducting pattern 55 having the same potential as the lower electrode 6 at the lower layer of the lower electrode 6, similar the first illustrative aspect.

Accordingly, the electrode pattern 88 is formed adjacent to the area of the second contact hole 12, so that it is possible to configure a surface area of the electrode pattern 88 greater than an opening area of the second contact hole 12 through which the conducting pattern having the same potential as the lower electrode 6 is exposed. Accordingly, since it is possible to increase a square measure of an interface between the electrode pattern 88 having the same potential as the lower electrode 6 and the liquid crystal 15. Accordingly, the remnant charges of the lower electrode 6 can move to the liquid crystal 15 more easily than the first illustrative aspect.

In addition, the electrode pattern 88 is formed on the same surface as the upper electrode 8 close to the interface with the liquid crystal 14. Accordingly, even when the film thickness of the oriented film 14 is higher than the top of the upper electrode 8 in the second contact hole 12, since the electrode pattern 88 is exposed to the same surface as the upper electrode 8, it is possible to effectively reduce the remnant charges of the lower electrode 6. Therefore, it is possible to reduce the screen burn-in more effectively than the first illustrative aspect.

Fifth Illustrative Aspect

Figure 10:
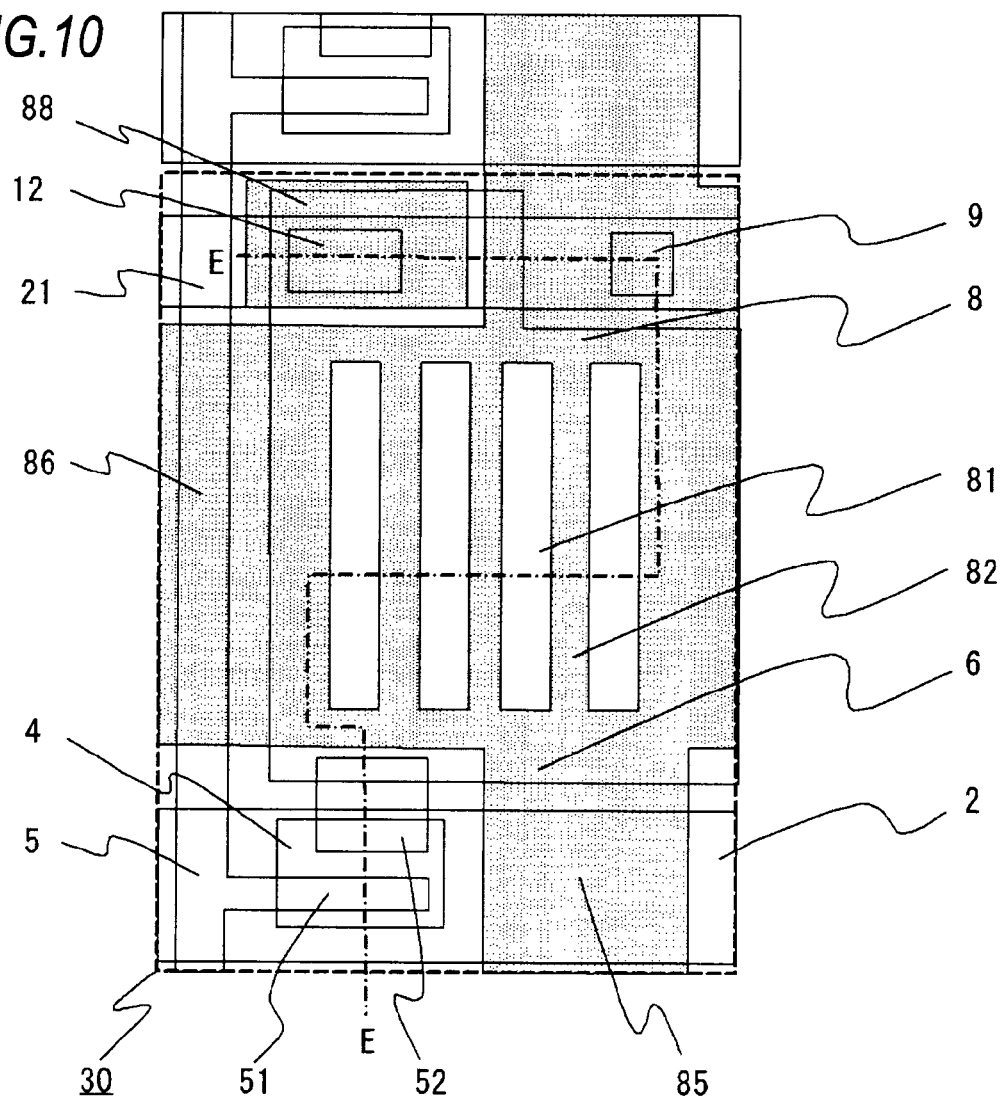
FIG. 10 is an enlarged plan view of a pixel of an array substrate according to a fifth illustrative aspect.
Figure 11:
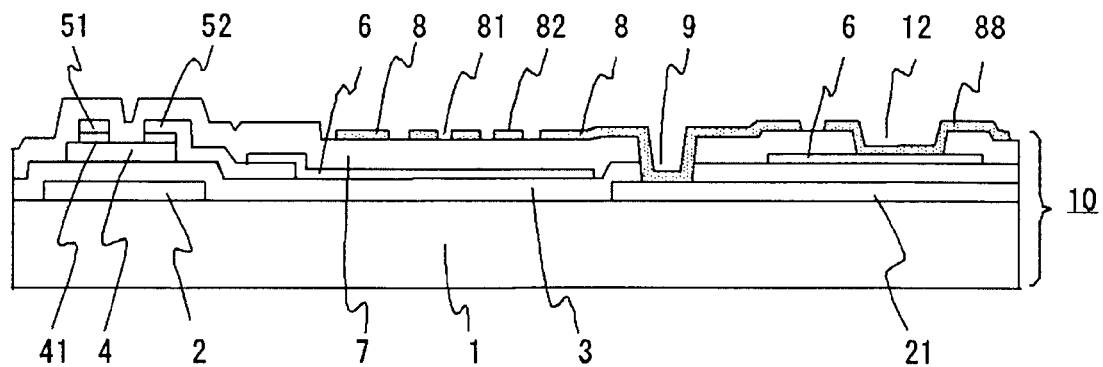
FIG. 11 is a cross sectional view taken along a line E-E of FIG. 10.

FIG. 10 is an enlarged plan view of a pixel of an array substrate in a liquid crystal display device according to a fifth illustrative aspect. FIG. 11 is a cross sectional view taken along a line E-E of FIG. 10.

The fifth illustrative aspect relates to improvement of the second illustrative aspect. According to the fifth illustrative aspect, the electrode pattern 88 is arranged adjacent to the area of the second contact hole 12 above the common line 21 of the reference potential arranged parallel to the scanning line 2, and the electrode pattern 88 is connected to a conducting pattern (here, a part of the lower electrode 6) having the same potential as the lower electrode 6. Thus, the electrode pattern 88 has the same potential as the lower electrode 6 being the pixel electrode. Although the electrode pattern 88 is formed at the same layer as the upper electrode 8, it is electrically separated from the upper electrode 8.

According to the fifth illustrative aspect, since the second contact hole 12 is covered by the electrode pattern 88 formed at the same layer as the upper electrode 8, the lower electrode 6 in the area of the second contact hole 12 is protected during the etching process of the upper electrode 8. Accordingly, since it is possible to utilize the conducting pattern having the same potential as the lower electrode 6 as a part of the lower electrode 6, it is not necessary to provide the conducting pattern 55 having the same potential as the lower electrode 6 at the lower layer of the lower electrode 6, like the second illustrative aspect.

Accordingly, the electrode pattern 88 is formed adjacent to the area of the second contact hole 12, so that it is possible to configure a surface area of the electrode pattern 88 greater than an opening area of the second contact hole 12 through which the lower electrode 6 is exposed. Accordingly, since it is possible to increase an square measure of an interface between the electrode pattern 88 having the same potential as the lower electrode 6 and the liquid crystal 15, the remnant charges of the lower electrode 6 can move to the liquid crystal 15 more easily than the second illustrative aspect.

In addition, the electrode pattern 88 is formed on the same surface as the upper electrode 8 close to the interface with the liquid crystal 14. Accordingly, even when the film thickness of the oriented film 14 is higher than the top of the upper electrode 8 in the second contact hole 12, since the electrode pattern 88 is exposed to the same surface as the upper electrode 8, it is possible to effectively reduce the remnant charges of the lower electrode 6. Therefore, it is possible to reduce the screen burn-in more effectively than the second illustrative aspect.

Sixth Illustrative Aspect

Figure 12:
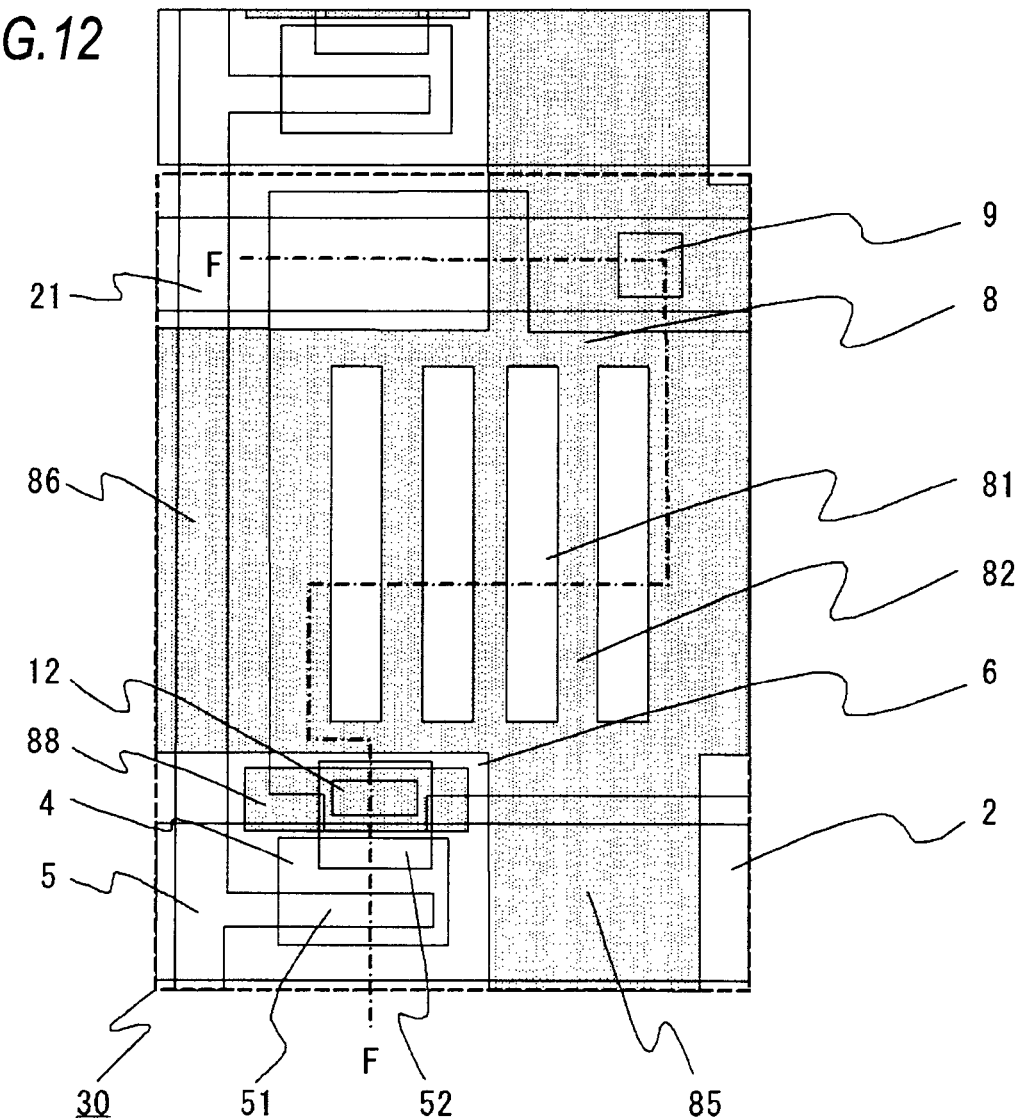
FIG. 12 is an enlarged plan view of a pixel of an array substrate according to a sixth illustrative aspect.
Figure 13:
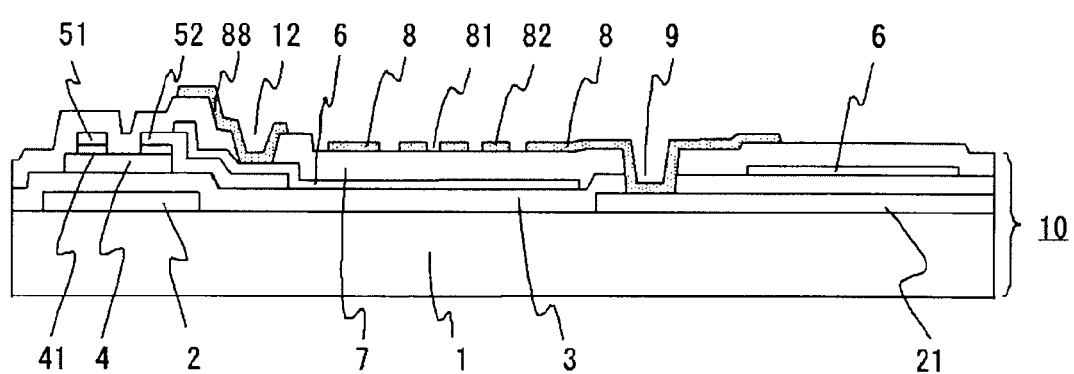
FIG. 13 is a cross sectional view taken along a line F-F of FIG. 12.

FIG. 12 is an enlarged plan view of a pixel of an array substrate in a liquid crystal display device according to a sixth illustrative aspect. FIG. 13 is a cross sectional view taken along a line F-F of FIG. 13.

The sixth illustrative aspect relates to improvement of the third illustrative aspect. According to the sixth illustrative aspect, the second contact hole 12 is formed on the drain electrode 52 and the electrode pattern 88 is arranged adjacent to the area of the second contact hole 12 and is connected to a part of the lower electrode 6 stacked on the drain electrode 52. The electrode pattern 88 has the same potential as the lower electrode 6 being the pixel electrode. Although the electrode pattern 88 is formed at the same layer as the upper electrode 8, it is electrically separated from the upper electrode 8.

According to the sixth illustrative aspect, since the second contact hole 12 is covered by the electrode pattern 88 formed at the same layer as the upper electrode 8, the lower electrode 6 in the area of the second contact hole 12 is protected during the etching process of the upper electrode 8. The conducting pattern having the same potential as the lower electrode 6 exposed through the second contact hole 12 may be either a part of the lower electrode 6 or the drain electrode 52.

Accordingly, the electrode pattern 88 is formed adjacent to the area of the second contact hole 12, so that it is possible to configure a surface area of the electrode pattern 88 greater than an opening area of the second contact hole 12 through which the lower electrode 6 is exposed. Accordingly, since it is possible to increase an square measure of an interface between the electrode pattern 88 having the same potential as the lower electrode 6 and the liquid crystal 15, the remnant charges of the lower electrode 6 can move to the liquid crystal 15 more easily than the third illustrative aspect.

In addition, the electrode pattern 88 is formed on the same surface as the upper electrode 8 close to the interface with the liquid crystal 14. Accordingly, even when the film thickness of the oriented film 14 is higher than the top of the upper electrode 8 in the second contact hole 12, since the electrode pattern 88 is exposed to the same surface as the upper electrode 8, it is possible to effectively reduce the remnant charges of the lower electrode 6. Therefore, it is possible to reduce the screen burn-in more effectively than the third illustrative aspect.

In the above illustrative aspects, the TFT of a channel etched inverted staggered type has been exemplified. However, an aspect of the present invention can be also applied to an FFS array substrate, in which a TFT of an etch-stopper inverted staggered type, a top gate type, etc., is used, and a liquid crystal display device using the same.

In the above illustrative aspects, the driving circuits are mounted by the COG mount technology. However, an aspect of the present invention can be also applied to an FFS array substrate, in which the driving circuits are mounted a Tape Automated Bonding (TAB) mount technology or in which the driving circuits are embedded and formed on the array substrate by TFTs, and a liquid crystal display devices using the same.

What is claimed is:

1. An array substrate comprising:
    a pixel defined by both a scanning line and a signal line intersecting with the scanning line, wherein a display area of the array substrate includes a plurality of said pixels arranged in a matrix, each said pixel including:
       a switching device;
       a lower electrode that is connected to the switching device;
       an insulating film that is formed over the lower electrode; and
       an upper electrode that is formed on the insulating film to generate a fringe electric field between the lower electrode and the upper electrode,
    wherein, in an area where the upper electrode is not formed and light is not transmitted, a contact hole through the insulating film is provided on a conducting pattern having a same potential as the lower electrode.

2. The array substrate according to claim 1,
    wherein the conducting pattern is a part of the lower electrode.

3. The array substrate according to claim 1,
    wherein the contact hole is formed above the scanning line.

4. The array substrate according to claim 1,
    wherein the contact hole is formed above a common line having a reference potential.

5. The array substrate according to claim 1,
    wherein the contact hole is provided on a drain electrode that is connected to the lower electrode of the switching device.

6. The array substrate according to claim 1, further comprising:
    an electrode pattern that is provided at a same layer as the upper electrode and is provided adjacent to the contact hole,
    wherein the electrode pattern is electrically separated from the upper electrode, and
    wherein the electrode pattern is connected to the lower electrode.

7. The array substrate according to one of claim 1,
    wherein the upper electrode of the pixel is connected to an adjacent upper electrode of an adjacent pixel.

8. A liquid crystal display device comprising:
    an array substrate including:
    a pixel defined by both a scanning line and a signal line intersecting with the scanning line, wherein a display area of the array substrate includes a plurality of said pixels arranged in a matrix, each said pixel having:
       a switching device;
       a lower electrode that is connected to the switching device;
       an insulating film that is formed over the lower electrode; and
       an upper electrode that is formed on the insulating film to generate a fringe electric field between the lower electrode and the upper electrode,
    wherein, in an area where the upper electrode is not formed and light is not transmitted, a contact hole through the insulating film is provided on a conducting pattern having a same potential as the lower electrode.

* * * * *